United States Patent
Christenson et al.

(10) Patent No.: US 7,156,927 B2
(45) Date of Patent: Jan. 2, 2007

(54) TRANSITION FLOW TREATMENT PROCESS AND APPARATUS

(75) Inventors: Kurt Karl Christenson, Minnetonka, MN (US); Nam Pyo Lee, Eden Prairie, MN (US); Gary William Michalko, Ham Lake, MN (US); Christina Ann Rathman, Bloomington, MN (US)

(73) Assignee: FSI International, Inc., Chaska, MN (US)

( * ) Notice: Subject to any disclaimer, the term of this patent is extended or adjusted under 35 U.S.C. 154(b) by 162 days.

(21) Appl. No.: 10/115,449

(22) Filed: Apr. 3, 2002

(65) Prior Publication Data
US 2003/0188765 A1  Oct. 9, 2003

(51) Int. Cl.
*B08B 3/00* (2006.01)

(52) U.S. Cl. .................. 134/27; 134/2; 134/3; 134/26; 134/28; 134/34; 134/36; 438/906

(58) Field of Classification Search .................. 134/2, 134/3, 26, 28, 34, 36, 27; 438/906
See application file for complete search history.

(56) References Cited

U.S. PATENT DOCUMENTS

| | | | |
|---|---|---|---|
| 3,824,137 A * | 7/1974 | Bok et al. | 216/92 |
| 3,955,270 A | 5/1976 | Loya | 29/580 |
| 3,964,957 A | 6/1976 | Walsh | 156/345 |
| 4,021,278 A | 5/1977 | Hood et al. | 156/626 |
| 4,544,446 A | 10/1985 | Cady | 156/639 |
| 4,577,650 A | 3/1986 | McConnell | 134/59 |
| 4,633,893 A | 1/1987 | McConnell et al. | 134/95 |
| 4,738,272 A | 4/1988 | McConnell | 134/59 |
| 4,740,249 A | 4/1988 | McConnell | 134/25.4 |
| 4,778,532 A * | 10/1988 | McConnell et al. | 134/10 |
| 4,795,497 A | 1/1989 | McConnell et al. | 134/18 |
| 4,856,544 A | 8/1989 | McConnell | 134/95 |
| 4,860,643 A | 8/1989 | Spearow | 98/115.3 |
| 4,899,767 A | 2/1990 | McConnell et al. | 134/56 R |
| 4,911,761 A | 3/1990 | McConnell et al. | 134/11 |
| 4,917,123 A | 4/1990 | McConnell et al. | 134/95 |
| 4,926,143 A | 5/1990 | Harada et al. | 331/156 |
| 4,966,649 A | 10/1990 | Harada et al. | 156/647 |
| 4,984,597 A | 1/1991 | McConnell et al. | 134/95 |
| 5,226,242 A | 7/1993 | Schwenkler | 34/78 |
| 5,336,371 A | 8/1994 | Chung et al. | 156/659.1 |

(Continued)

FOREIGN PATENT DOCUMENTS

JP  4-162723  6/1992

(Continued)

OTHER PUBLICATIONS

"Scientific Rinsing and Drying on Macro and Microscale", Verhaverbeke et al, CFM Technologies, West Chester, PA, 1996 Semiconductor Pure Water and Chemicals Conference.

(Continued)

*Primary Examiner*—M. Kornakov
(74) *Attorney, Agent, or Firm*—Kagan Binder, PLLC

(57) ABSTRACT

A method is provided for treating an object. In this method, a treating chemical is introduced to a bath under conditions effective to at least partially envelop the object to be treated in eddy currents of the bath liquid, followed by introducing non-treating liquid into the bath under conditions effective to at least partially envelop the object to be treated in eddy currents of the bath liquid. An apparatus for carrying out this method is also provided.

This method is particularly beneficial for objects used in precision manufacturing by treatment with solutions, such as semiconductor wafers or similar substrates.

32 Claims, 11 Drawing Sheets

U.S. PATENT DOCUMENTS

| | | | |
|---|---|---|---|
| 5,383,484 A | 1/1995 | Thomas et al. | 134/184 |
| 5,542,441 A | 8/1996 | Mohindra et al. | 134/95.2 |
| 5,631,171 A | 5/1997 | Sandstrom et al. | 436/518 |
| 5,730,162 A | 3/1998 | Shindo et al. | 134/66 |
| 5,772,784 A | 6/1998 | Mohindra et al. | 134/21 |
| 5,817,185 A | 10/1998 | Shindo et al. | 134/25.4 |
| 5,838,484 A | 11/1998 | Goossen | 359/282 |
| 5,868,150 A | 2/1999 | Mohindra et al. | 134/135 |
| 5,868,898 A | 2/1999 | Liu et al. | 156/345 |
| 5,882,598 A | 3/1999 | Lindquist et al. | 422/82.02 |
| 5,919,311 A | 7/1999 | Shive et al. | 134/1 |
| 5,922,624 A | 7/1999 | Verhaverbeke et al. | 438/743 |
| 5,932,027 A | 8/1999 | Mohindra et al. | 134/21 |
| 5,932,493 A | 8/1999 | Akatsu et al. | 438/745 |
| 5,951,779 A | 9/1999 | Koyanagi et al. | 134/2 |
| 5,972,123 A | 10/1999 | Verhaverbeke | 134/3 |
| 5,976,198 A | 11/1999 | Suhara et al. | 29/25.01 |
| 5,976,311 A | 11/1999 | Han | 156/345 |
| 6,004,399 A | 12/1999 | Wong et al. | 134/2 |
| 6,027,602 A | 2/2000 | Hung et al. | 156/345 |
| 6,032,682 A | 3/2000 | Verhaverbeke | 134/1.3 |
| 6,041,938 A | 3/2000 | Senn | 206/711 |
| 6,108,932 A | 8/2000 | Chai | 34/245 |
| 6,128,829 A | 10/2000 | Wolke et al. | 34/259 |
| 6,128,830 A * | 10/2000 | Bettcher et al. | 34/404 |
| 6,129,091 A | 10/2000 | Lee et al. | 134/3 |
| 6,132,522 A | 10/2000 | Verhaverbeke et al. | 134/26 |
| 6,136,724 A | 10/2000 | Hansen et al. | 438/745 |
| 6,138,694 A | 10/2000 | Hansen et al. | 134/58 |
| 6,143,087 A | 11/2000 | Walter | 134/1 |
| 6,153,533 A | 11/2000 | Senn | 438/745 |
| 6,164,300 A | 12/2000 | Schonleber et al. | 134/135 |
| 6,165,912 A | 12/2000 | McConnell et al. | 438/758 |
| 6,170,703 B1 | 1/2001 | Butler et al. | 222/1 |
| 6,189,552 B1 | 2/2001 | Oshinowo | 134/201 |
| 6,227,212 B1 | 5/2001 | Konishi et al. | 134/1.3 |
| 6,244,282 B1 | 6/2001 | Weber | 134/135 |
| 6,245,158 B1 | 6/2001 | Verhaverbeke | 134/10 |
| 6,245,250 B1 | 6/2001 | Krawzak et al. | 216/83 |
| 6,248,670 B1 | 6/2001 | Hung et al. | 438/745 |
| 6,261,845 B1 | 7/2001 | Verhaverbeke et al. | 436/55 |
| 6,264,036 B1 | 7/2001 | Mimken et al. | 206/711 |
| 6,284,055 B1 | 9/2001 | Dryer et al. | 134/10 |
| 6,286,688 B1 | 9/2001 | Mimken et al. | 211/41.18 |
| 6,293,288 B1 | 9/2001 | Shindo et al. | 134/57 |
| 6,325,081 B1 | 12/2001 | Miki et al. | 134/102.1 |
| 6,328,809 B1 | 12/2001 | Elsawy et al. | 134/3 |
| 6,348,101 B1 | 2/2002 | Walter | 134/1 |
| 6,352,082 B1 | 3/2002 | Mohindra et al. | 134/25.4 |
| 6,423,146 B1 | 7/2002 | Fukazawa | 134/2 |
| 6,488,037 B1 * | 12/2002 | Guldi | 134/4.3 |
| 6,982,006 B1 * | 1/2006 | Boyers et al. | 134/3 |
| 2001/0003299 A1 | 6/2001 | Furukawa | 156/345 |
| 2001/0017143 A1 | 8/2001 | Bergman | 134/3 |
| 2001/0023700 A1 | 9/2001 | Drayer et al. | 134/1.3 |
| 2001/0027799 A1 | 10/2001 | Bergman | 134/3 |
| 2001/0029965 A1 | 10/2001 | Bergman | 134/3 |
| 2001/0037822 A1 | 11/2001 | Elsawy et al. | 134/30 |
| 2002/0011257 A1 | 1/2002 | Degendt et al. | 134/3 |
| 2002/0029788 A1 | 3/2002 | Verhaverbeke et al. | 134/1.3 |

FOREIGN PATENT DOCUMENTS

| | | |
|---|---|---|
| JP | 10163164 A | 12/1996 |
| JP | 10-112454 | 4/1998 |
| JP | 2000005714 A | 6/1998 |
| JP | 2000021839 | 1/2000 |
| JP | 2000183005 | 6/2000 |
| WO | WO 02/062494 | 11/2001 |

OTHER PUBLICATIONS

Froment et al, 4 pgs, Chemical Reactor Analysis and Design, TP157.F76,1979.

Besson et al, 4 pgs, Low Consumption Front End of the Line Cleaning:LC-FEOL; Solid State Phenomena vol. 76-77 (2002).

Mattson Products, 15 pgs www.mattson.com/products/wet2.htm; Products description pages from website, Jul. 23, 2002.

Tardif et al, 4 pgs, New Aspects of the Diluted Dynamic Clean Process; Solid State Phenomena vol. 65-66 (1999).

SCP Global Technologies, 9pgs, www.scpglobal.com; Products description pages from website, Jul. 23, 2002.

Screen, 17 pgs, www.screen.co.jp; Products description pages from website, Jul. 23, 2002.

SES Products, 15 pgs, www.ses-corp.co.jp; Products description pages from website, Jul. 23, 2002.

TEL USA, 6 pgs, www.telusa.com; Products description pages from website, Jul. 23, 2002.

Verteq, 14 pgs, www.verteq.com; Products description pages from website, Jul. 23, 2002.

Boelen, et al, "Evaluation of Advanced Pre-Gate Cleanings," Electrochemical Society Proceedings, vol. 99-36. pp. 59-68, 2000.

Tardif, et al, Performance of "DDC": Diluted Dynamic Clean Before 4.5 nm Gate Oxide, Electrochemical Society Proceedings vol. 97-35. pp. 15-22, 1999.

Tardif, et al, Optimization of HF and Oxidant Wet Cleanings Before 7 nm Gate Oxide, Electrochemical Society Proceedings, vol. 95-20, pp. 49-59, 1996.

* cited by examiner

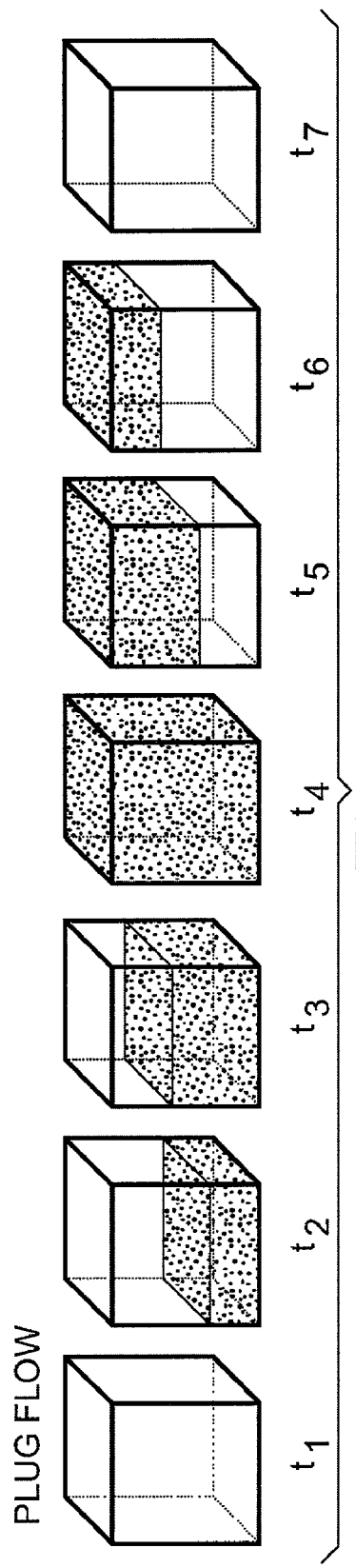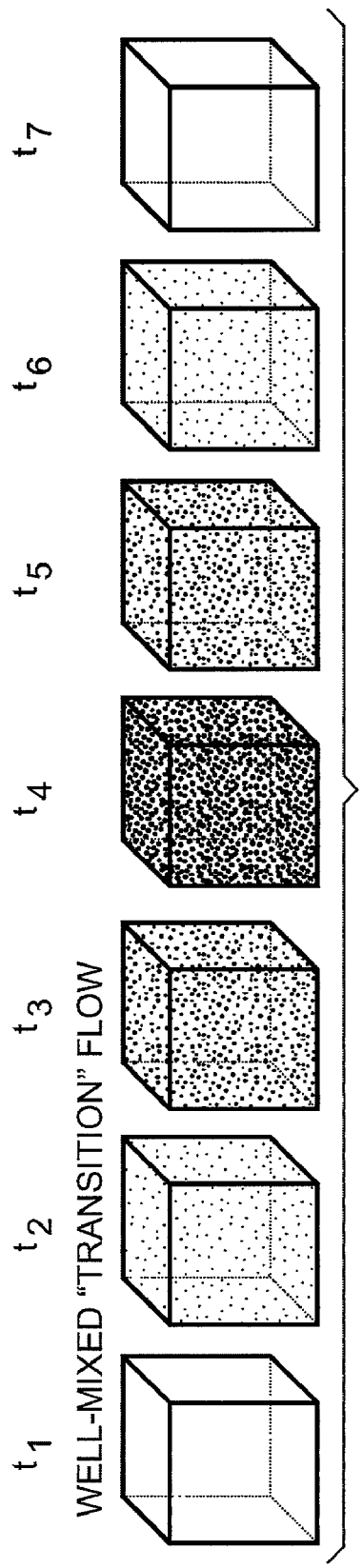
Fig. 7 PRIOR ART — PLUG FLOW
Fig. 8 — WELL-MIXED "TRANSITION" FLOW

TRANSITION FLOW TREATMENT PROCESS AND APPARATUS

FIELD OF THE INVENTION

The present invention relates to the field of treating objects by a liquid such as for cleaning or otherwise treating one or more surfaces of the object. In particular, the present invention is directed to a method and apparatus for treating objects, such as a microelectronic substrate or other device, and in particular, for subjecting one or more surfaces of the object to a liquid for treating it.

BACKGROUND OF THE INVENTION

The present invention has been developed, in particular, for its application to objects that are treated with a solution, such as semiconductor wafers or similar substrates, whether raw, etched with any feature, coated, or integrated with conductor leads or traces as an integrated circuit device, lead frames, medical devices, disks and heads, flat panel displays, microelectronic masks, micromechanical devices, microoptical devices, and the like. These objects have become increasingly more and more difficult to treat because they are being manufactured in smaller and smaller sizes, and contain extremely small features to be generated and treated. Precision manufacturing techniques are required to properly generate such component parts. Thus, layers of various materials with low toleration for variance, and the generation of very small features at submicron size in the layers of such objects, are created by chemical treatment and etching processes. Uniformity of layers and precise quantities of treatments are required to provide the functionality of the component within the final microelectronic device.

A variety of techniques have been developed for the treatment of objects in precision manufacturing processes, particularly for treatment of semiconductor wafers. For example, semiconductor wafers may be dipped in a series of internal chambers of respective treatment vessels that provide separate treatment of the wafers. For example, the wafer may first be imparted with an oxide layer, followed by dipping in an acid bath for etching away some or all of the oxide. The acid bath may then be followed by a rinsing bath. An example of one such treatment vessel is of the type that uses cascade liquid flow processes for batch processing. In a typical cascade liquid flow process, one or more wafers are supported within a cascade processing vessel, such as within a wafer treating fixture, cassette, or other holder, to be treated at the same time. A cascade processing vessel includes an inner vessel having side walls that permit liquid to spill over the top edge and into one or more outer vessels provided about the inner vessel. A flow of liquid is supplied to the inner vessel, e.g. at the vessel bottom, to fill its internal chamber and to further cause liquid to cascade over the top edge of the internal chamber into an outer chamber. Thus, new liquid (e.g. clean water) can be supplied to rinse the wafers within the internal chamber and then to cascade from the internal chamber into the outer chamber. Liquid flows through the inner vessel during this process.

A proposed modification of wet processing methods for treatment of electronic components is provided in U.S. Pat. No. 5,817,185. See column 1, lines 46–56 and column 13, lines 31–58. The disclosure of the '185 patent describes traditional wet processing methods that use chemical(s) in the reaction chamber to displace DI water at the same temperature. This usually causes substantial mixing of the chemicals and the DI water. A claimed improvement on this process is disclosed in U.S. Pat. No. 6,245,158. The '158 patent states that mixing "causes the chemicals to be continuously diluted with water, which is undesirable since it is both environmentally preferable and cost effective to recycle the chemical solutions. In addition, it takes significantly longer to rinse when mixing occurs than if no mixing occurs." See column 2, lines 18–36. The proposed solution of the '158 patent is to selectively control the temperature of the process liquids, such as by introducing cooler liquid from the bottom of the treatment vessel to minimize mixing of one liquid with another liquid.

In essence, thermocline principles are used to keep the liquids relatively separate from each other. Under the theory described in the '158 patent, if minimal mixing occurs, the chemical solution is quickly removed from the vessel, as in plug-flow techniques. It has been observed that true plug-flow conditions are very difficult to achieve, resulting in heterogeneous treatment of wafers. Thus, one portion of the wafer may be exposed to etchant for a longer period of time or at a different concentration than other portions of the wafer, causing a difference in performance of the wafer depending on the location of evaluation of the wafer.

SUMMARY OF THE INVENTION

It has surprisingly been found that more uniform treatment of objects may be accomplished by introducing a treating chemical to a bath under conditions effective to at least partially envelop the object to be treated in eddy currents of the bath liquid, followed by introducing non-treating liquid into the bath under conditions effective to at least partially envelop the object to be treated in eddy currents of the bath liquid. The method as described herein provides baths that are spatially uniform in concentration, meaning that the concentration of a chemical(s) is well-mixed so as to be as relatively constant as practically feasible throughout the volume of the bath, or at least near the objects to be treated, at any given time. For brevity, "uniform" shall mean "spatially uniform" unless otherwise qualified.

In practical effect, the present method causes a non-reactive bath to be first transitioned to a bath containing one or more treatment chemicals, and then transitioned back to a non-treating liquid bath. Preferably, the object(s) are immersed throughout the rinse-treat-rinse treatment. Material introduced to the bath is well-mixed with the bath contents so that, at a particular point in time, the chemical nature of the bath near the object(s) to be treated, and preferably throughout its volume, is as uniform as practically desired. Consequently, the substantial entirety of surfaces being treated tend to be exposed to a similar treatment. This results in substantial improvement in the uniformity of the treatment.

This "Transition-Flow" process is especially useful for carrying out etching treatments with excellent uniformity. While not being bound by theory, it is believed that the transitions of the environment of the object in the bath from a solution containing no treating chemical to substantially uniform increase in concentration of a treating chemical, followed by substantially uniform decrease in concentration of the treating chemical in the solution minimizes any differences in total treating effect at different locations on the object to be treated. In particular, it is believed that the effects of any slight spatial non-uniformities during the increase in concentration are diminished by similar, but opposite, non-uniformities during the decrease in concentration. In one aspect, one or more transitional chemical treatments all sandwiched between preferred rinsing treatments.

An apparatus for carrying out the process as described above is also provided.

In the present invention, uniform changes in concentration are produced by introducing flow(s) of liquid and/or gas into the vessel with enough velocity and momentum such that eddy currents at least partially, and preferably substantially, envelop the object(s) being treated. These currents flow through the bath proximately to the object, producing a homogenous concentration of chemical(s) in the liquid through mixing. Eddy currents can be generated by any mixing mechanism, such as the use of spray orifices for introducing liquids (and/or gas as the case may be) in a mixing manner into the bath. Alternatively, pumps, impellers, bubblers, and the like may be used to provide a mixing action. The degree of mixing can be assessed by injecting dye into the liquid, and visually evaluating or by measuring through the use of quantitative analysis techniques the amount and flow of the dye at various locations of the liquid bath. A sodium salt of fluorescein dye is particularly effective in visualizing flow patterns in water.

As one aspect, the present invention provides a method of treating at least one object, comprising the steps of causing the object to be immersed in a flowing, substantially nonreactive bath; spatially, uniformly transitioning the bath from a substantially nonreactive bath to a bath comprising a first treatment chemical; and spatially, uniformly transitioning the bath comprising the first treatment chemical to a substantially nonreactive bath. As another aspect, the present invention provides a method of treating at least one object, comprising the steps of: a) immersing and object in a bath comprising a liquid; b) while the object is immersed in the bath, mixingly introducing a treatment chemical into the bath, thereby increasing the concentration of the treatment chemical in the bath in a non-step manner; and c) while the object is immersed in the bath comprising the treatment chemical mixingly introducing a liquid into the bath under conditions such that the concentration of the treatment chemical in the bath is reduced in a non-step manner.

The present invention is applicable in any situation where one or more objects are to be treated by a uniform wet process within a vessel by contact with liquid, such as steps of rinsing, cleaning, drying, coating, etching and the like. In particular, the present invention is directed to the treatment of objects for precision manufacturing using solutions, such as semiconductor wafers or similar substrates, whether raw, etched with any feature, coated, or integrated with conductor leads or traces as an integrated circuit device, lead frames, medical devices, disks and heads, flat panel displays, microelectronic masks, and the like. Processes of present invention are particularly useful for in-process semiconductor wafers, because of the exceptional uniformity of treatment that is possible through the present process for such wafers. Wafers particularly benefiting from the present process include wafers requiring critical or highly uniform etches of thin dielectric materials. Also, the present process is particularly useful for wafers containing three-dimensional micromechanical features, such as MEMS. Specific examples of three-dimensional micromechanical features include pressure transducers and accelerometers. The present process is also particularly useful for devices incorporating very small-scale optics features, such as Eschelle gratings for fiber-optic communications.

BRIEF DESCRIPTION OF THE DRAWINGS

FIG. 7 is a graphic schematic representation of the concentration in an internal chamber of a treatment vessel using a prior art plug flow system for treating objects in the internal chamber of the treatment vessel;

FIG. 8 is a graphic schematic representation of the concentration of an internal chamber of a treatment internal chamber of the treatment vessel using a uniform "transition flow" approach for treating objects in the internal chamber of the treatment vessel in accordance with the present invention;

DETAILED DESCRIPTION OF THE PREFERRED EMBODIMENTS

The above mentioned and other advantages of the present invention, and the manner of attaining them, will become more apparent and the invention itself will be better understood by reference to the following description of the embodiments of the invention taken in conjunction with the accompanying drawings.

The present invention provides a surprisingly uniform treatment of objects to be treated. For example, in the case of an etching treatment, it is highly desired to etch material as uniformly as possible. Too much variation, e.g., nonuniformity, can lead to poor quality devices or devices that do not work. Uniformity is a particular concern as feature size on the object to be treated gets smaller and smaller.

With reference to the figures, wherein like numerals are used to label like components throughout the several figures, apparatus and systems are described for treating one or more objects by exposure to a uniform increase of concentration of treating chemical, followed by a uniform decrease of concentration of treating chemical, thereby providing substantially uniform treatment of the object(s).

Figure 1:
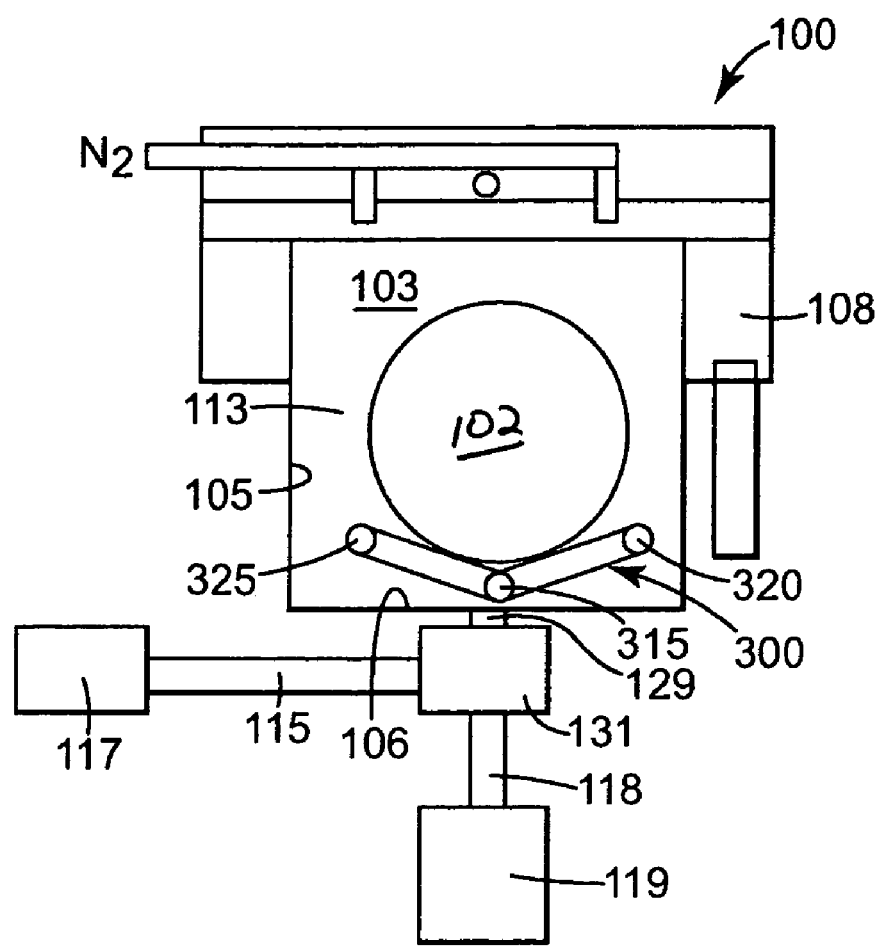
FIG. 1 is a schematic diagram of a treatment vessel in accordance with the present invention for treating one or more objects, such as in-process semiconductor wafers.

FIG. 1 is a schematic diagram of a representative treatment vessel 100 in accordance with the present invention designed for desired liquid mixing dynamics as liquid 103 flows within an internal chamber 113 of the treatment vessel 100 along and past one or more objects, such as a semiconductor wafer(s) 102, as illustrated. For brevity in the following discussion, the object to be treated will be referred to as semiconductor wafers. It will be appreciated that the process and apparatus as discussed herein benefit the treatment of a wide variety of objects, such as discussed in the Summary of the Invention section above and otherwise throughout this specification.

Internal chamber 113 initially contains liquid 103 that is a non-treating liquid. A preferred, internal chamber 113 is tapered or otherwise shaped or configured to eliminate dead spots as corners or other locations within internal chamber 113. For purposes of the present invention, a "non-treating liquid" is a liquid that does not perform the treatment process intended to be carried out in the primary process of the present invention. Preferably, a non-treating liquid is substantially inert to the desired chemistry and physical properties of the object to be treated. In the instance of semiconductor wafers, examples of preferred non-treating liquids include any liquid suitable for rinsing treatments, such as water (preferably filtered and/or deionized), isopropyl alcohol or ethylene glycol. Alternatively, the non-treating liquid may be a liquid that interacts with the object to achieve a treatment other than the primary treatment process to be carried out using the process of the present invention. Preferably, the action, if any, of the non-treating liquid on the object is not highly concentration sensitive, so that the introduction of the object to the non-treating liquid in any manner, such as lowering the object into a bath of the non-treating liquid, does not introduce variations in the desired properties of the object. Examples of non-treating liquids that do have an activity with respect to the object include certain ozone treatments or treatments that run to completion within the time frame of immersion of the object in the non-treating liquid, thereby rendering any concentration gradients that may be experienced by the object moot.

Non-treating liquid may be provided from a source 117 through a supply pipe 115 and introduced into chamber 113 by any suitable liquid distribution mechanism, for example by way of the preferred liquid distribution heads 325, 315 and 320, described below. Non-treating liquid provides a rinsing function, and also causes liquid flow within the internal chamber 113 along and past the semiconductor wafers 102. Between the source 117 and the internal chamber 113, a suitable filtering mechanism, such as a filter bank (not shown) can be optionally provided that preferably comprises a suitable combination of filters that are typically used for point of use applications. Preferably, ultra-purified water is used that is substantially free from particles greater than about 0.5 microns, more preferably free from particles greater than about 0.2 microns, and most preferably free from particles greater than about 0.1 microns. To accomplish this, distilled and/or deionized water can be run through charged filters, such as are described and illustrated in U.S. Pat. No. 5,542,441 granted Aug. 6, 1996 and entitled Method and Apparatus for Delivering Ultra-low Particle Counts in Semiconductor Manufacturing, the entire disclosure of which is incorporated herein by reference. Such a filter bank provides for ultra-purified DI water (deionized water).

The treatment vessel 100 preferably comprises structure including a continuous sidewall 105 that along with a bottom wall 106 defines the internal chamber 113 for containing one or more wafers 102 and liquid 103. The sidewall 105 and bottom wall 106 are preferably made from similar material that is, at least on its internal surface, substantially nonreactive with liquid 103. Preferred materials include quartz, polypropylene, polyethylene, perfluoroalkoxylvinylether (PFA), polytetrafluoroethylene (PTFE), polyvinylidene fluoride (PVDF), combinations of these, and others.

The treatment vessel 100 contains a structure to provide a flow system for introducing and withdrawing liquid. For purposes of the present invention, a "flow system" is a system that provides new liquid to the treatment vessel, with simultaneous withdrawal of liquid from the bulk of the treatment vessel.

Preferably, the treatment vessel 100 is in the form of an overflow cascade-type vessel, as discussed above in the Background section, wherein the structural sidewall 105 and bottom wall 106 define an inner chamber 113 from which liquids may cascade over the upper edge of the sidewall 105 and into an outer chamber that is defined by an outer vessel 108. In that way, a continuous supply of liquid can run past the supported wafers for rinsing and cleaning them. At any one time, the input and output flows may be equal to each other, or one may be greater than the other, for example, if it is desired to adjust the amount of liquid in the vessel 100. A preferred flow system is one that may be used to help establish a steady, overflowing, cascade flow of liquid through vessel 100 and overflowing the top of vessel 100 as desired.

Alternatively, the treatment vessel 100 may provide for liquid flow through its internal chamber 113 in any other way. For example, the internal chamber 113 may be closed at its upper end and provided with an outlet in a convenient location(s) so that liquid flows through a confined chamber within which one or more objects may be supported. It is contemplated the liquid may be provided through one or more inlets, and may exit through one or more outlets relative to internal chamber 113.

Note also that the manner by which the objects, preferably semiconductor wafers 102, are supported within the internal chamber 113 is not a specific feature of the subject invention, and that any conventional or developed technique (not shown) is contemplated for use in accordance with subject invention. It is preferable, however, that the supporting mechanism not substantially prevent mixing by interfering with the flow of liquids across the surface of the wafer(s). Moreover, the objects may be supported at any different orientation as determined to provide desired results.

In accordance with the present invention, one or more liquid distribution devices, such as the preferred distribution head assembly 300 comprising one or more preferred heads 325, 315 and/or 320 are supported within the internal chamber 113 of the treatment vessel 100. In a preferred embodiment, distribution heads 325, 315 and 320 are located at the lower portion of inner chamber 113. More preferably, distribution heads 325, 315 and 320 are located below the centerpoint of wafer 102, and particularly preferably below the lower third of wafer 102. Most preferably, central distribution head 315 is located directly below wafer 102 at the midpoint of the wafer, and side distribution heads 325 and 320 are located on either side of central distribution head 315 at a distance from center measurably of 40% to 60% of the total width of the object to be treated, or in the embodiment as shown, 40% to 60% of the diameter of the circular shaped semiconductor wafer 102.

Each liquid distribution head 325, 315 and 320 is connected with the liquid source 117 by way of supply pipe 115. As illustrated, supply pipe 115 is operationally connected to provide liquid communication to the liquid distribution heads 325, 315 and 320 by way of a liquid mixing chamber 131 and secondary supply pipe 129. Secondary supply pipe 129 subdivides to feed liquid to distribution heads 325, 315 and 320 with independent tertiary supply pipes (not shown). Alternatively, each liquid distribution head may be preferably connected to a liquid mixing chamber 131 by way of independently associated secondary supply pipes. The supply pipe 129, and or subdivided plumbing there from may be preferably sealingly provided through openings (not shown) through bottom wall 106 of the internal chamber 113 so that liquid 103 is effectively provided to heads 325, 315, and 320 within the internal chamber 113.

Liquid mixing chamber 131 provides a means by which liquid can be supplied from a single supply pipe 115 and equally distributed to the preferably plural liquid distribution heads 325, 315 and 320 (or more). The design of such a liquid mixing chamber 131 can be conventional, and preferably provides substantially even liquid flow to each secondary supply pipe 129. Moreover, the liquid mixing chamber 131 allows one or more treating chemicals to be mixed or otherwise combined into the non-treating liquid from treating chemical source 119 via treating chemical supply pipe 118. Furthermore, it is contemplated that any number of supply pipes may be provided to one or more common liquid mixing chambers from which one or more liquids are then supplied through secondary supply pipes 129 to liquid distribution heads 325, 315 and 320. Liquid mixing chamber 131 may be provided with baffles, impellers, or other physical structures to assist in mixing, or alternatively may simply be a location in each supply pipe 115 wherein the treatment chemical is injected directly into the supply pipe 115 without a physical structure contained therein to assist in mixing. In this embodiment, mixing occurs as the liquid progresses down supply pipe 115 without the use of a separate mixing structure. Most preferably, liquid distribution heads and the geometry of the inner chamber and structures therein are arranged and oriented to minimize "dead zones" or areas of non-mixing in the treatment vessel. Dead zones may result in undesirable retention of treating chemical in the treatment vessel, which may lead to non-uniformities of concentration of the liquid or slow the progress of the rinsing process.

Figure 2:
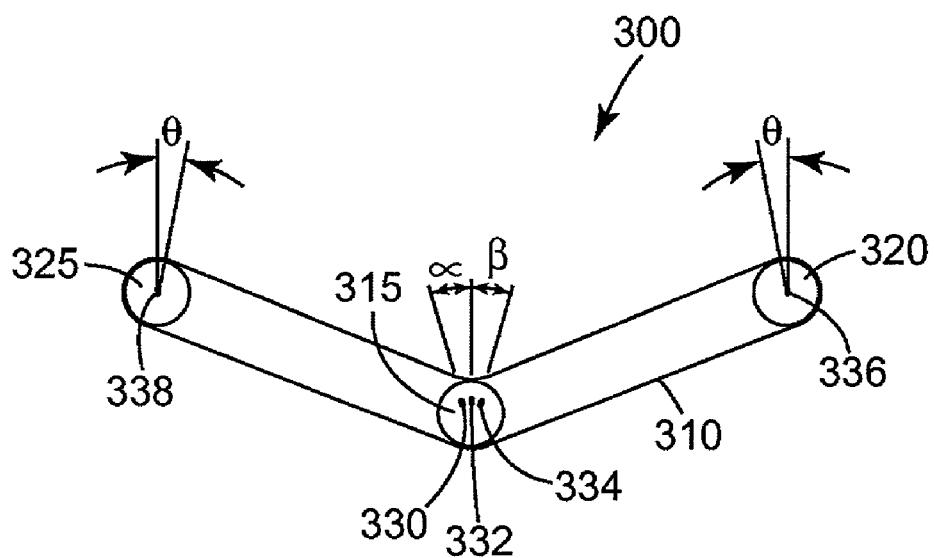
FIG. 2 is a side view of a preferred liquid distribution head assembly of the present invention used in the vessel of FIG. 1.

FIG. 2 is a side view showing the preferred liquid distribution head assembly 300 of the present invention in more detail. Assembly 300 comprises sparger body 310 having central sparger 315 and side spargers 320 and 325 located therein. Central sparger 315 is provided with a plurality of orifices 330, 332 and 334 directing a stream of liquid from central sparger 315 in a manner to provide effective distribution of liquid into the internal chamber of the treatment vessel, thereby facilitating mixing of the liquid discharged from the central sparger 315 into the internal chamber of the treatment vessel. In a preferred embodiment, central orifices 332 direct streams of liquid vertically from central sparger 315, and side orifices 330 and 334 direct streams of liquid at angles alpha and beta from the central stream. Preferably, angles alpha and beta are from 10–30 degrees from the stream from central orifice 332, and most preferably from 20–25 degrees from the stream from central orifice 332. Side spargers 320 and 325 are similarly provided with arrays of orifices 336 and 338, respectively, that direct streams of liquid from the spargers. Preferably, orifices 336 and 338 direct streams of liquid at angles theta that are canted inward from vertical from the sparger. Preferably, angle theta is from minus 10 degrees to plus 25 degrees from vertical, more preferably from minus 5 degrees to plus 10 degrees and more preferably from plus 1 degree to plus 5 degrees, most preferably plus three degrees from vertical. Positive angles orient the streams in towards the wafers 102 and negative angles orient the streams out towards the walls 105 of the chamber.

The relative orientation of the orifices are preferably positioned to optimize mixing of incoming liquid in the inner chamber of the treatment vessel, taking into account the shape of the inner chamber, size and orientation of objects to be treated, and relative positioning of other liquid distribution heads within the chamber either by routine empirical modification or calculation of liquid dynamics as is understood by those of skill in this art. It will be understood that any number of spargers or orifices may be provided in accordance with the present invention, with said spargers and orifices positioned to provide effective mixing of the liquid introduced into the internal chamber of the treatment vessel.

Figure 3:
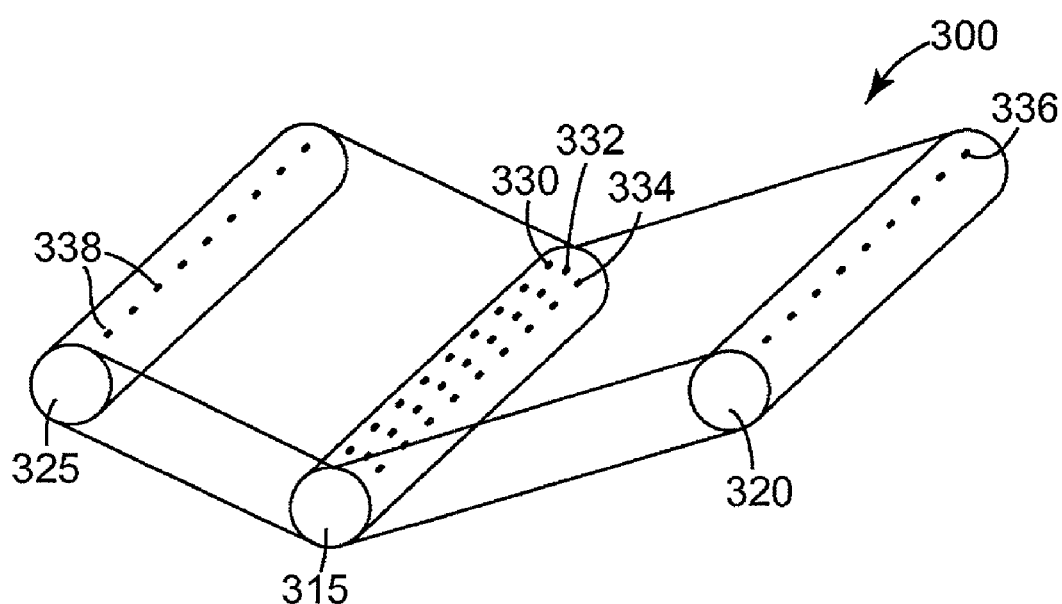
FIG. 3 is a perspective view of the liquid distribution head as shown in FIG. 2.

FIG. 3 is a perspective view of a liquid distribution head assembly 300 of the present invention as shown in FIG. 2. In the embodiment as shown, spargers 315, 320 and 325 extend axially with multiple orifices arrayed therein to provide effective liquid flow and mixing for larger internal chamber of the treatment vessels capable of accommodating multiple objects to be cleaned. Preferably each sparger comprises about 40 to about 60 orifices in each row, with the orifices having a diameter of about 1 to about 3 mm, with a spacing of about 3 to about 10 mm between each orifice in a row. As shown, orifices are provided in linear and regularly spaced arrays. When processing 300 mm diameter wafers held in a carrier at a 5 mm pitch, the orifices are preferably approximately 2 mm in diameter and spaced at 5 mm intervals to match the pitch of the wafers in the carrier. Alternatively, orifices may be provide in non-linear and non-regular arrays, so long as the liquid is introduced into the inner chamber to provide a bath with uniform concentration of treating chemical as discussed herein. Preferably, the treatment vessels of the present invention are designed to accommodate multiple objects, such as arrays of 13, 25 or 50 wafers to be treated in a single batch process. In a preferred embodiments, the spargers are located within the walls 105 of the internal chamber 113, so that no head assembly extends into internal chamber 113. Liquid is introduced into internal chamber 113 at a relatively high rate of speed relative to the bulk flow of liquid through internal chamber 113. Preferably, the fluid streams enter the bath liquid at a velocity of at least about 1,000 cm/min., more preferably at least about 4,000 cm/min. and most preferably at least about 6,000 cm/min. The velocity of the fluid stream is calculated at the point of entry of the fluid stream into the internal chamber 113 of the treatment vessel. This is in contrast to the velocity of the bulk flow of liquid through the bath, which is preferably from about 10 to about 100 cm/min., and more preferably from about 20 to about 50 cm/min. The velocity of the bulk flow of liquid through the bath is determined by dividing the volumetric flow rate of the liquid through the chamber by the cross-sectional area of the chamber. The difference in fluid stream flow velocity from the bulk flow velocity generates eddy currents in the inner chamber 113 effective to mix the liquids very efficiently. The fluid streams therefore enter the bath liquid at a location substantially free of baffles, diffusers, or other velocity reducing means between the orifice and the wafer that would prevent eddy currents from carrying out their mixing function in proximity to the wafer to be treated. Preferably, the ratio of fluid stream velocity upon entering the vessel to bulk flow velocity is at least about 10:1, more preferably at least about 50:1, and most preferably at least about 150:1.

Figure 4:
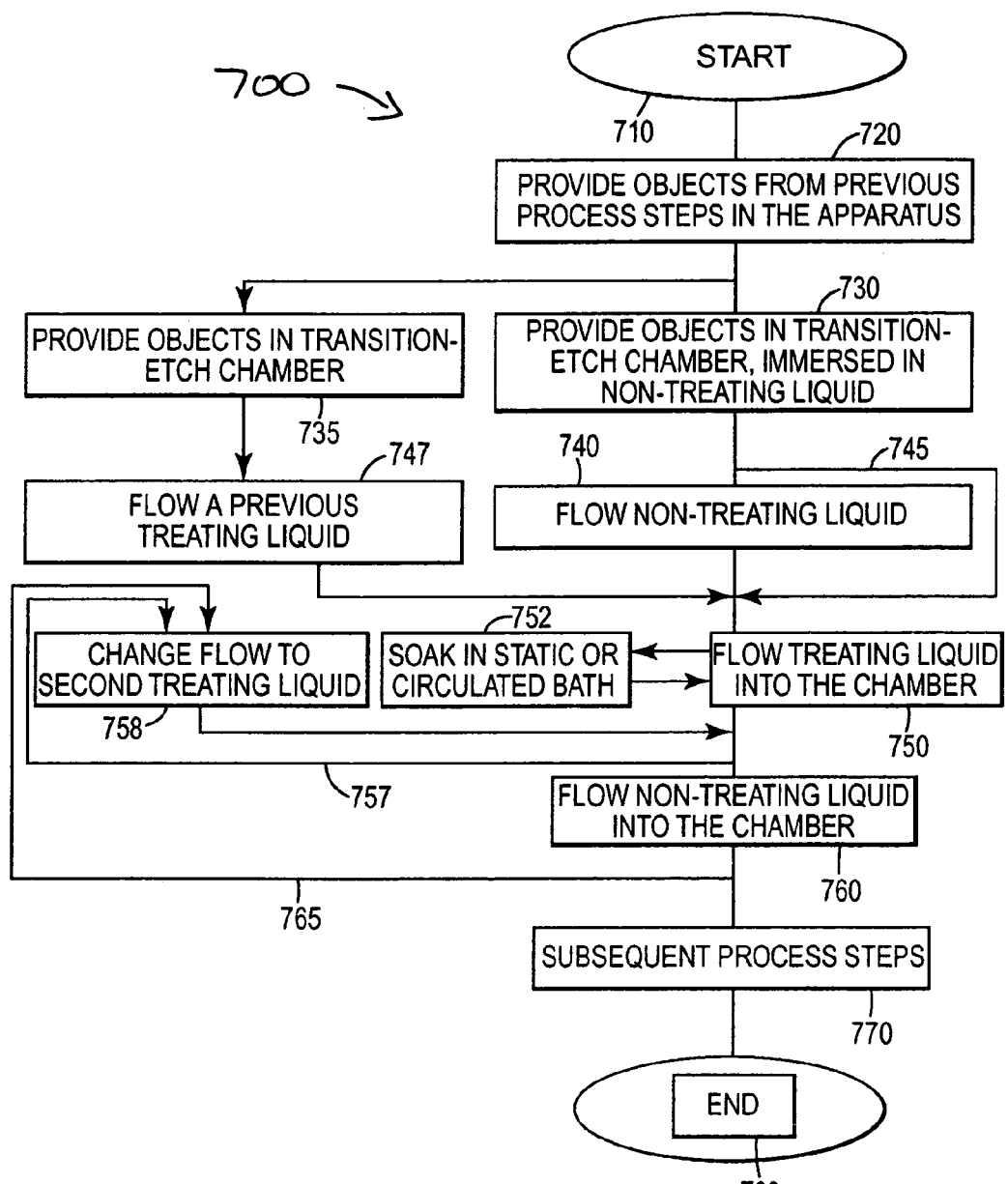
FIG. 4 is a simplified flow diagram for a representative method for treating objects according to an embodiment of the present invention.

FIG. 4 is a representative flow diagram of a method 700 starting at step 710 for treating objects according to an embodiment of the present invention.

Step 720 represents providing objects subsequent to previous processing steps performed on the objects. Such objects may preferably be one or more semiconductor wafers or other microelectronic devices or substrates. Previous processing steps could include liquid chemical treatments, lithographic processes, gas-based etch or chemical treatments, high temperature treatments, or other processing steps. Previous processing steps could have occurred in another process apparatus, in another portion of the apparatus containing the transition-etch chamber, or in the transition-etch chamber itself.

In step 730, the objects are placed in the transition-etch chamber and immersed in non-treating liquid (e.g., DI water). The objects can be inserted into a preexisting bath of non-treating liquid, or placed into an empty or partially filled chamber that is then filled.

Liquids are introduced into the chamber through distribution heads. The liquid flow from the distribution heads creates eddy currents in the bath that provide bulk-mixing that maintains a relatively uniform liquid composition throughout the bath. It is also possible to create the mixing in the bath by some other means (e.g., a pumped recirculation loop, an impeller in the bath, a bubbler in the bath, moving the wafers within the bath or in and out of the bath, or other means).

In step 740, a flow of non-treating liquid into the chamber is begun and continued until the flow dynamics of the bath is established. Excess liquid can be removed from the chamber, for example, by cascade overflow. While less desirable, it is possible to omit step 740 (following process path 745) and begin step 750 with a substantially static, non-flowing liquid in the bath.

In step 750, a flow of treating chemical (e.g., dilute HF) into the chamber is begun, optionally with stopping or reducing the flow of non-treating liquid into the chamber. The treating chemical can come from a pre-mixed source, be produced by blending flows from multiple sources, be produced by injecting a treating-liquid concentrate into a flow of the non-treating liquid, or come from some other source. If the treating chemical blend is formed by blending multiple components, it is preferable that the blended liquid be thoroughly mixed before delivery into the chamber; blending in the chamber is possible, but less desirable. This does not, however, exclude the use of treating chemicals whose compositions or temperatures vary with time. The treating chemical is introduced into manner to provide spatially uniform transition of the bath from a substantially nonreactive bath to a bath comprising a treating chemical. This transition is distinguished from plug flow transitions, wherein a discernible boundary exists between a first liquid moving through the chamber and a second liquid moving through the chamber. In the process of the present invention, any such boundary is substantially eliminated.

It is also possible to form the treating chemical by injecting a treating-liquid concentrate into the bath of non-treating liquid. For instance 200 cc of HF could be added to a 40 liter bath of DI water to form a 200:1 HF etching solution. In this case, some form of circulation is required to disperse the treating-liquid concentrate throughout the bath (e.g., a pumped recirculation loop, an impeller in the bath, a bubbler in the bath, moving the wafers within the bath or in and out of the bath, or other means).

In step 760, the flow of treating chemical into the chamber is stopped and the flow of non-treating liquid is continued, increased or resumed. The flow of non-treating liquid dilutes the treating chemical present in the bath from step 750. The flow of non-treating liquid is continued until the concentration of treating chemical in the bath has reached acceptable levels to begin the next process step. The acceptable levels can vary greatly depending on the concentration and composition of the treating chemical, and the nature of the next process step. For instance, dilution of the treating chemical from step 750 in step 760 by a factor of 100 would typically be acceptable for an etch using 200:1 HF as the treating chemical followed by a process to regrow an oxide layer on the silicon wafer using ozonated water. In contrast, dilution factors of more than one million would typically be required between a treatment with a 1:2 blend of $H_2SO_4:H_2O_2$ followed by a drying process utilizing surface-active agents.

Step 770 represents subsequent process steps. Typical steps include: growing an oxide layer on the objects with ozonated water, growing an oxide layer and removing particles with an SC-1 chemistry (a blend of $NH_4OH$, $H_2O_2$ and DI water), removing metallic contamination with an SC-2 chemistry (a blend of HCl, $H_2O_2$ and DI water), drying the objects with a surface-active agent, or other process.

Step 799 represents the end of the sequence of processes performed in the transition-etch chamber.

Many variations on this description of the inventive method are possible. For instance, the combination of steps 735 and 747 represent supplying objects to the transition etch chamber and flowing a previous treating chemical into the transition-etch chamber, and then beginning the flow of the treating chemical immediately, without an intermediate flow of a non-treating liquid (as in 740). For example, it may be desirable to flow ozonated water to the chamber to eliminate organic contamination and then transition directly to dilute HF to etch a layer of $SiO_2$.

Likewise, it may be desirable to stop the flow of treating chemical and let the objects soak in the existing bath as in 752. This soaking can be in either a static bath, or a bath with means of circulation (e.g., a pumped recirculation loop, an impeller in the bath, a bubbler in the bath, moving the wafers within the bath or in and out of the bath, or other means). At the end of the soak period 752, the flow of treating chemical can begin again or the flow of non-treating liquid can begin.

After the flow of the treating chemical 750, subsequent treatments with a second treating chemical 758 can occur either without an intermediate treatment with non-treating liquid by process path 757 or with an intermediate treatment of non-treating liquid by process path 765. It is also possible to repeat 758 for treatment with a third liquid, and so on. For example, it may be desirable to flow HCl in DI water to remove metals from the surface of a silicon wafer (or prevent their deposition) directly after the wafer is etched with dilute HF (process path 757).

Figure 5:
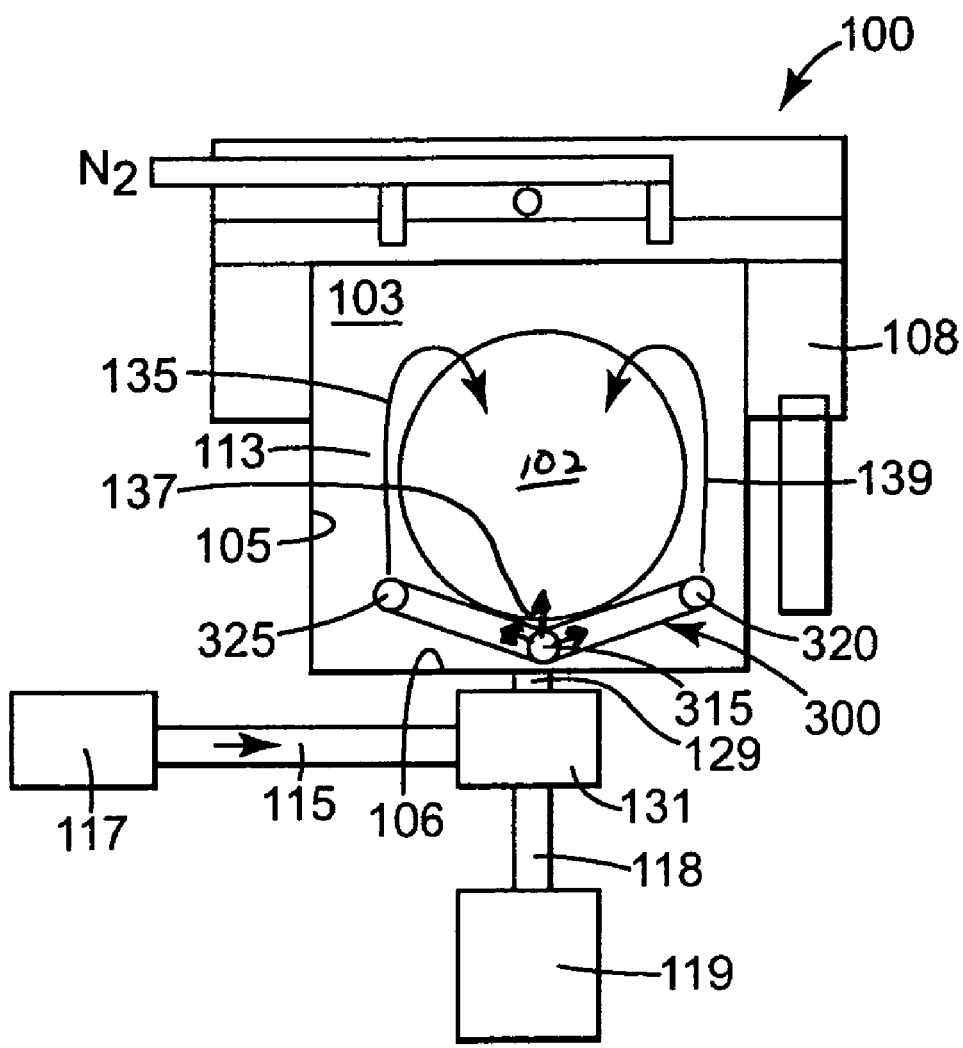
FIG. 5 is a schematic diagram of treatment vessel as shown in FIG. 1, showing liquid flow patterns in the internal chamber during operation.

FIG. 5 is a schematic diagram of treatment vessel 100 of FIG. 1 in accordance with the present invention showing idealized mixing and flow of liquid 103 flowing through internal chamber 113 of the treatment vessel 100. The flow of liquid through the treatment vessel is established by providing liquid from liquid source 117, through liquid mixing chamber 131 and outputted through liquid distribution heads 325, 315 and 320. Liquid distribution heads 325, 315 and 320 are located and provided with orifices such that flow patterns 135, 137 and 139 are established to provide a uniform liquid composition at the location(s) of wafer(s) 102.

Representative idealized flow patterns are illustrated in FIG. 5. However, the flow of liquid into the internal chamber 113 may be in any orientation such that a desired degree of uniform liquid composition results. Preferably, liquid distribution heads 325, 315 and 320 are spaced adequately from wafer 102 so that liquid being introduced into internal chamber 113 is not immediately contacted with wafer, but rather has sufficient space and opportunity to mix at least to some degree with liquid already located in internal chamber 113. Preferably, the liquid distribution head is spaced at least about 10 mm away, and preferably at least about 15 mm away from wafer 102. Surprisingly, it has been found that rather than directing the incoming liquid away from the wafer, it is preferable to direct the incoming liquid somewhat toward the wafer, establishing immediate mixing and flow of the treating chemical across the wafer. Fluid streams 135, 137 and 139 as illustrated generate a series of eddy currents that effectively mix the new liquid being introduced with the liquid already in the internal chamber of the treatment vessel uniformly across the surface of the wafer without attempting to accomplish plug flow of liquid in the internal chamber of the treatment vessel. Spacing of the distribution head from the wafer may vary with respect to the position and orientation of the distribution head in the internal chamber 113. For example, side distribution heads 325 and 320 as shown do not to direct fluid streams directly at wafer 102 along the shortest possible path, but rather as a somewhat angled approach. Thus, distribution heads 325, 315, and 320 are preferably positioned from about 10 to about 40 mm from wafer 102, and more preferably are positioned from about 20 to about 35 mm from wafer 102. Fluid streams 135, 137 and 139 preferably travel a distance of from about 10 to about 50 mm, and more preferably from about 20 to about 45 mm from distribution heads 325, 315, and 320 to wafer 102.

After establishing flow of liquid 103 through internal chamber 113, treating chemical is introduced from treating chemical source 119 through supply pipe 118 into liquid mixing chamber 131. Treating chemical is mixed in the liquid mixing chamber with non-treating liquid at a predetermined ratio, e.g., at desired relative volumetric, molar, and/or mass flow rates, to provide the desired amount of treating chemical in the overall composition for treatment of wafer 102. For example, in a preferred embodiment, 0.1 to 100, preferably 1 to 20, more preferably 5 to 10 parts of an aqueous etchant solution comprising 49 wt. % HF is injected into 1000 parts of water, the combination of which is introduced into internal chamber 113 of the treatment vessel 100. Preferably, this liquid is applied to internal chamber 113 at any desired flow rate, such as 20 to 80 lpm, and preferably about 40 l/min. It will be understood that the treating chemical may alternatively be introduced in a plurality of stages at varying concentrations to provide a range of concentration profiles (i.e., concentration of treating chemical in the tank as a function of time) as desired.

Treatment of the objects is carried out at one or more temperatures effective for carrying out the desired treatment. In certain applications, it may be advantageous to provide the treatment at either an elevated temperature or at a reduced ambient temperature. Thus, while standard processing ambient temperature may be in the range of 18–25° C., it may be desired in some modes of practice to carry out an HF etching step at a temperature of 35–45° C. in order to reduce chemical usage. In one embodiment of the present treatment process the introduction of liquid into the internal chamber 113 may be stopped, and the wafers are allowed to soak during the treatment, either in a static bath or with the liquid in the tank being recirculated, such as by a pump.

Additionally, a plurality of treating chemicals may be introduced into internal chamber 113, either simultaneously or in successive introductions. In one embodiment of the present invention, the flow of non-treating liquid from non-treating liquid source 117 is completely cut off, providing an undiluted concentration of treating chemical from the treating chemical source 119. Optionally, treating chemical from the source 119 may be prediluted to the desired level of concentration for treatment. The concentration of treating chemical in the liquid flowing from liquid mixing chamber 131 into internal chamber 113 may be varied gradually or may be abruptly changed. In an alternative embodiment, treating chemical HF can be directed directly into the chamber with mixing at the same time as the non-treating liquid, through separate conduits.

Other arrangements for liquid distribution heads are illustrated in FIGS. 6A–F. These Figs. illustrate that one or more such liquid distribution heads may be provided, as desired for a particular application. Thus, for example in embodiment 610 as shown in FIG. 6A, distribution heads 612 and 614 are located within the internal chamber. In contrast, FIG. 6B shows distribution heads 622 and 624 located adjacent to the internal chamber, so that orifices direct fluid streams into the internal chamber. The embodiment shown in FIG. 6C is similar, having three distribution heads 632, 634 and 636. The embodiment shown in FIG. 6D has distribution heads 642 and 644 offset an adjacent to the side walls of the internal chamber. FIG. 6E shows to distribution heads, 652 and 654, located adjacent to the side walls of the internal chamber, near the bottom of the chamber. Finally, FIG. 6F. shows an array of four distribution heads, 662, 664, 666 and 668, array at the side walls of the internal chamber. Preferably, the one or more liquid distribution heads are arranged relative to the structural design of the treatment vessels and to each other in order to provide mixing within their respective internal chambers. It is contemplated that any number of similar or differently sized liquid distribution heads may be provided as needed for a particular application.

Figure 6:
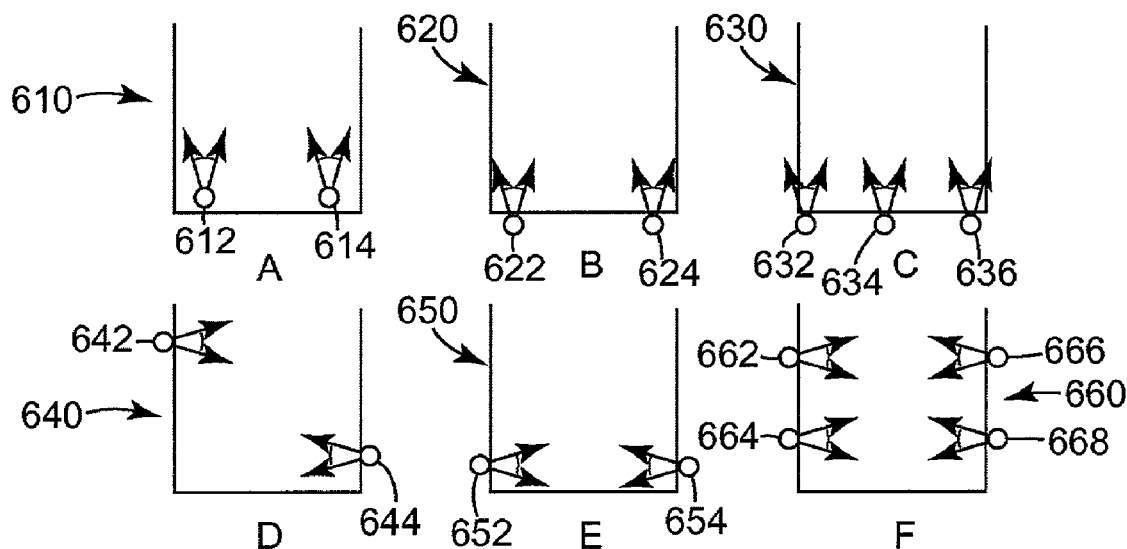
FIGS. 6A–F are schematic diagrams of treatment vessels, showing alternative placements of orifices and liquid flow patterns in the internal chamber during operation.

Spray orientations of the flow of liquid being introduced into the bath are represented by arrows, the two arrows with an arc as shown in FIG. 6 indicates that a jet may enter at a range of possible angles. Note that jets can come in from sparger bars or through the walls of the tank. The configurations represented in FIGS. 6D, 6E and 6F are particularly suitable for certain applications, because the orifices for introducing fluid streams are located away from the bottom of the inner chamber, the preferred location for a source of megasonic energy if desired. This location of distribution heads therefore provides the smallest amount of interference with megasonic energy transducers located at the bottom of the bath.

FIG. 7 is a graphic idealized representation of the concentration of a treating chemical in an internal chamber over time of a treatment vessel using a prior art plug flow system for treating objects as described in U.S. Pat. No. 6,245,158. In this figure, the presence, location and relative concentration of the treating chemical is represented by shading of that portion of the internal chamber of the treatment vessel in which the chemical is located. In the plug flow type of system, at time t1, the concentration of the treating chemical in the solution is zero. At time t2, treatment solution has been introduced to the internal chamber of the treatment vessel from the bottom of the internal chamber of the treatment vessel, with excess liquid in the internal chamber of the treatment vessel spilling out over the top of the internal chamber of the treatment vessel. Because the treatment solution is introduced carefully to provide substantially no mixing with the existing liquid in the internal chamber of the treatment vessel, there is a boundary between the two solutions. Consequently, the bottom portion of the internal chamber of the treatment vessel contains treatment solution near full concentration, with the top portion of the internal chamber of the treatment vessel containing liquid having substantially no treatment solution contained therein. At time t3, treatment solution continues to progress from the bottom of the internal chamber of the treatment vessel to top of internal chamber of the treatment vessel, again without mixing with existing liquid in the internal chamber of the treatment vessel. At time t4, the full internal chamber of the internal chamber of the treatment vessel contains treatment solution at full concentration. At time t5, liquid that is free from treatment solution is introduced to the internal chamber of the internal chamber of the treatment vessel from the bottom of the internal chamber of the treatment vessel. Again, because the liquid is introduced carefully to provide no mixing with existing liquid in the internal chamber of the treatment vessel, the bottom portion of the internal chamber of the treatment vessel contains substantially no treating chemical, and the top portion of the internal chamber of the treatment vessel contains substantially full concentration of treating chemical. At time t6, additional liquid that is free of treating chemicals continues to progress from the bottom of the internal chamber of the treatment vessel to top of the internal chamber of the treatment vessel, thereby displacing the liquid containing treating chemical, again without substantial mixing of the two liquids in the internal chamber of the treatment vessel. At time t7, all of the treating chemical has been purged from the internal chamber of the treatment vessel.

FIG. 8 is a graphic idealized representation of the concentration of the treating chemical in an internal chamber of a treatment vessel using a uniform transition flow system for treating objects in accordance with the present invention. In this figure, the presence, location and relative concentration of the treating chemical is represented by shading of that portion of the internal chamber of the treatment vessel in which the chemical is located. At time t1, the concentration of the treating chemical in the solution is zero. At time t2, treatment solution has been introduced to the internal chamber of the treatment vessel, preferably from the bottom of the internal chamber of the treatment vessel, with excess liquid in the internal chamber of the treatment vessel spilling out over the top of the internal chamber of the treatment vessel. Because the treatment solution is introduced to provide a uniform liquid composition, whereby the treating chemical is thoroughly mixed with the existing liquid in the internal chamber of the treatment vessel, the treating chemical is located throughout the internal chamber of the treatment vessel at essentially the same concentration at all portions thereof. At time t3, more treatment solution has been added to the internal chamber from the bottom of the internal chamber of the treatment vessel, again with thorough mixing. At this time, the concentration of the treating chemical is higher than the concentration that was observed at t2, represented by the darker shading of the total volume of the internal chamber of the treatment vessel. At time t4, the full internal chamber of the internal chamber of the treatment vessel contains treatment solution at essentially the full concentration desired for treatment of the object in the internal chamber of the treatment vessel. At time t5, liquid that is free from treatment solution is introduced to the internal chamber of the internal chamber of the treatment vessel from the bottom of the internal chamber of the treatment vessel. Again, because the liquid is introduced carefully to provide complete mixing with existing liquid in the internal chamber of the treatment vessel, the treating chemical is located throughout the internal chamber of the treatment vessel at essentially the same concentration at all portions thereof, which concentration is lower than the concentration of treating chemical in the internal chamber of the treatment vessel at time t4. At time t6, yet more liquid that is free of treating chemicals have been introduced into the internal chamber of the treatment vessel, further diluting the treating chemical available in the internal chamber of the treatment vessel on a uniform basis. At time t7, essentially all of the treating chemical has been purged from the internal chamber of the treatment vessel by progressive dilution.

Figure 9:
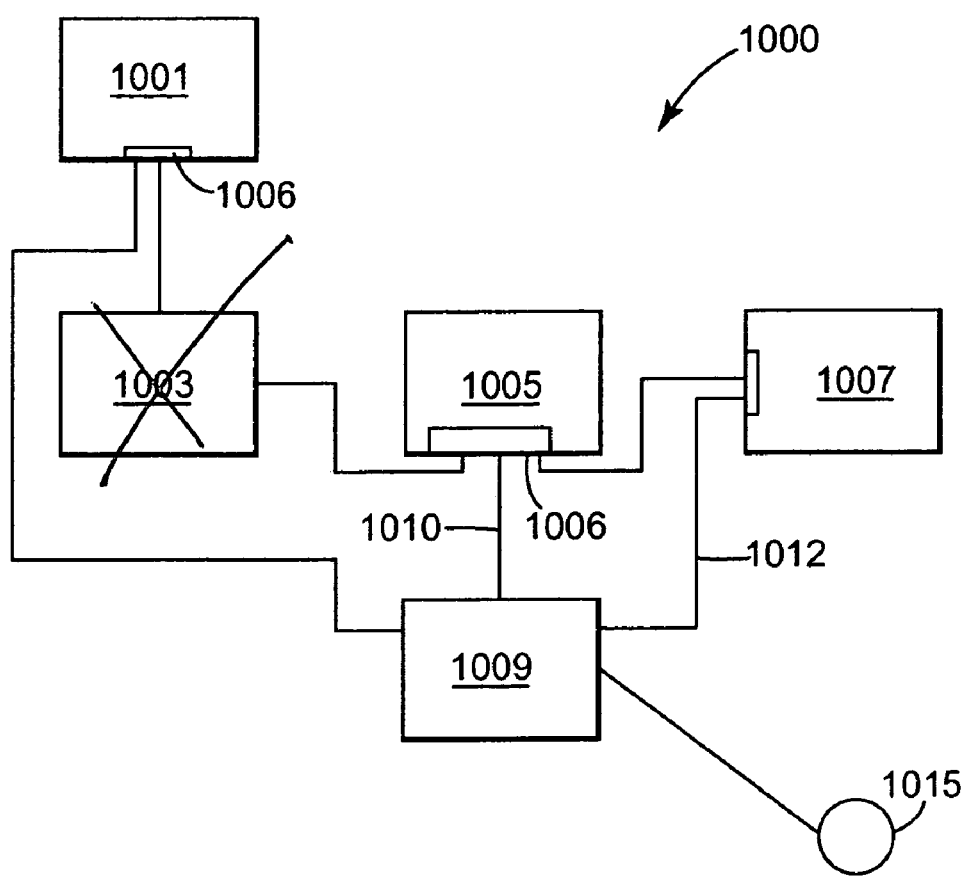
FIG. 9 is a simplified block diagram of a treatment system in accordance with the subject invention including a treatment vessel.

In FIG. 9, a block diagram of the treatment system 1000 is illustrated in accordance with the present invention. System 1000 is an example in accordance with the present invention including a treatment vessel 1005. It is understood that any number of different systems may be otherwise provided including such a treatment vessel 1005 and that any number of other configurations and components may be provided as desired.

The system 1000 includes the treatment vessel 1005, a controller 1009, an injector 1007, and a liquid source 1001. The system also includes a number of flow control valves 1006 that are preferably operatively coupled to the controller 1009 and the other components as indicated. In operation, non-treating liquid enters the system from the liquid source 1001. A control valve 1006 at the source 1001 controls the flow of non-treating liquid by way of the controller 1009. The non-treating liquid preferably comprises a non-treating liquid such as DI water (deionized water).

This second control valve 1006 is also preferably connected with the injector 1007 so that a treating chemical may be introduced with the non-treating liquid. The second control valve 1006 may be provided within a liquid mixing chamber or otherwise. As above, each of the control valves are preferably connected with the controller 1009 to provide liquid flow as desired and to effectively control when a chemical is to be injected as indicated by line 1012. The controller 1009 may comprise any known or developed control system, such as a microprocessor. Any number of feedback sensors 1015 may also be connected with the controller 1009 in order to effectively control any specific treatment process.

The aforementioned embodiments may also be used in other selected semiconductor fabrication process steps. In an alternative specific embodiment, the present cleaning technique can be applied before other semiconductor process applications. These process applications are described in great detail in a text written by Stanley Wolf and Richard N. Tauber, Semiconductor Processing For The VLSI Era, Vol. 1: Process Technology (1986) (herein "WOLF"). For example, the present technique is applied as a pre-epitaxial, pre-diffusion, pre-metal, pre-poly, pre-implant, pre-photoresist, and pre sacrificial oxide cleaning techniques.

In an alternative embodiment, the present cleaning technique can be applied after performing a selected semiconductor fabrication process. An example of this fabrication process includes nitride deposition, polish cleans (e.g., Chemical-Mechanical Polishing or CMP), buffered oxide etches, and metal deposition. These process steps also are described in great detail in the text by WOLF.

It is presently contemplated that any number of additional steps may also be carried out on the objects to be treated, either before or after the treatment steps as described herein, depending on a particular application. In particular, post treatment steps known in the art may provide particular benefit when used in conjunction with the treatment steps as described above. For example, subsequent rinsing steps using plug flow or near-plug flow conditions may provide reductions in rinse water usage. In this embodiment, after the treatment liquid has been removed from the processing internal chamber of the treatment vessel by uniform concentration decrease, application of a series of varying temperature rinse flows (as disclosed in U.S. Pat. No. 6,245,158, the disclosure of which is hereby incorporated by reference) may particularly provide beneficial results in cleanliness of the final product. Similarly, a drying process utilizing surface-active agents for removal of the non-treating liquid as described above is contemplated as providing particular benefit. Such apparatus and methods are described and illustrated in U.S. Pat. No. 5,772,784 granted Jun. 30, 1998 and entitled Ultra-low Particle Semiconductor Cleaner, the entire disclosure of which is incorporated herein by reference. Additionally, the process as described herein may be augmented by use of additional techniques to enhance the effectiveness of the treatment process, such as application of heat, sonic energy, and the like to the object in the process.

The principles of the present invention will now be described in connection with the following illustrative examples. The inventive method can apply to a wide range of treating and non-treating liquids and objects being treated. For brevity, however, the examples will use HF, DI water and 300 mm diameter silicon wafers covered by 1,000 A of $SiO_2$ as the treating chemical, non-treating liquid and objects, respectively. The purpose of the illustrative processes is to etch uniformly the $SiO_2$ layers that cover the surfaces of the wafers.

EXAMPLE 1

Measuring the Uniformity of Chemical Concentration

For purposes of the present invention, the process of the present invention is carried out such that a uniform increase or decrease of concentration of the treating chemical is observed during each transition in bath content. This evaluation is preferably carried out proximally to the surface of the object to be treated. A solution is considered to be uniform in concentration if, at any given time in the process, the concentration of the treating chemical varies by no more than about 50%, and preferably no more than about 20% near the surface of the object to be treated. Areas of the bath far from the treated surfaces are not of interest and are not to be included in concentration measurements.

The concentration near the surface of an object to be treated can be determined by any appropriate technique, such as by measuring the conductivity of the liquid at representative locations in the liquid to be evaluated. In this range of concentrations, the HF concentration is very nearly proportional to the conductivity of the solution. In the case of multiple semiconductor wafers arranged in a process fixture with a small gap between each wafer, small electrodes can be inserted between adjacent wafers and the local conductivity determined by electrical measurements.

For example, 52, 300 mm wafers were loaded in a Process Enhancement Cassette (Entegris, Chaska, Minn.) and immersed in a 40 liter bath of DI water (non-treating liquid) flowing at 40 lpm. The transition to 200:1 dilute HF (treating chemical) was performed by injecting 200 cc/min of 49 wt % HF into the 40 lpm flow of DI water. Conductivity probes consisted of two, 1 cm long electrodes, separated by 3 mm, spanning the gap between adjacent wafers in the locations shown in FIG. 10. The conductivity was determined by applying a 1 v peak-to-peak sine wave at 1 kHz (Agilent 33120A Arbitrary Waveform Generator) and measuring the resulting current once every four seconds with a Wavetek HD 160 digital volt meter beginning at the start of the HF injection.

Figure 10:
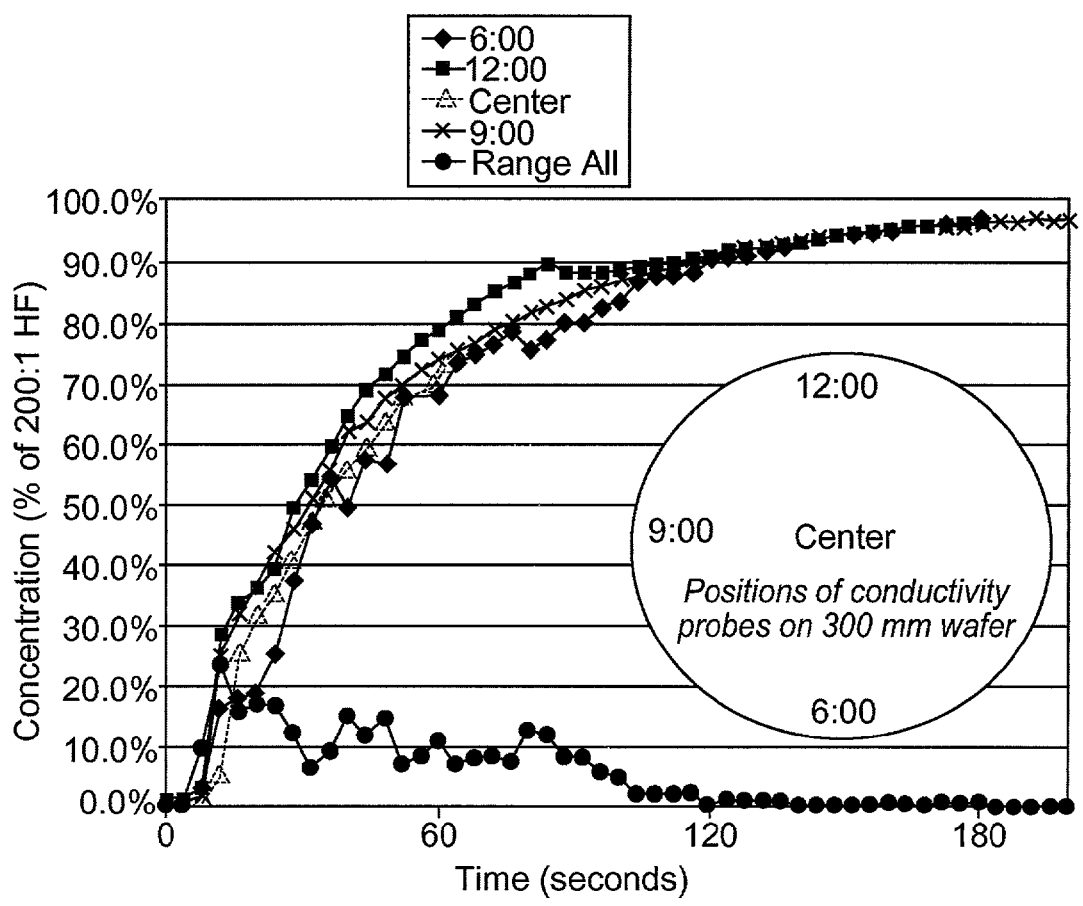
FIG. 10 is a graph showing measured HF concentrations, together with a schematic diagram of a semiconductor wafer, with locations of sampling as indicated.

As seen in FIG. 10, the concentration at each of the measurement locations increases uniformly. At all times, there is less than a 20% variation in the concentration between any two points on the wafer.

EXAMPLE 2

Measuring the Uniformity of the Etch

In the case of etching, the amount of material removed by an etching process is measured at several points on the surface of the wafer. At least 9 to 121 sites are typical, with 49 or so measurements being preferred.

In the case of measuring the uniformity of the $SiO_2$ etching process at 49 sites evenly distributed on a 300 mm diameter silicon wafer used in the production of semiconductor devices, the following procedure can be used. The initial thickness of the $SiO_2$ is measured at each point on a Rudolph Caliber 300 ellipsometer, commercially available from Rudolph Research, or the equivalent, and the measured values stored in its on-board computer (the "pre" measurement). The wafer is then processed with a treating chemical (typically dilute HF) to etch away some of the $SiO_2$, rinsed and dried. The thickness of $SiO_2$ at the same 49 points on the wafer is then re-measured on the ellipsometer (the "post" measurement). The location of the 49 points on the wafer is defined by the standard 49 point pattern supplied with the ellipsometer.

$Delta_n$, the amount etched at site n, is the difference in the pre and post measurements at site n:

$$Delta_n = pre_n - post_n$$

The average etch is the arithmetic mean of the individual $delta_n$:

$$Average = (1/n) * \text{summation of } delta_n \text{ from } n=1 \text{ to } 49$$

The range of the etch is the difference between the largest etch delta and the smallest etch delta:

$$Range = delta_{max} - delta_{min}$$

The range is the critical measure of the uniformity of an etching process. The quality of an etch process is often characterized by specifying the average etch and the deviation above and below the average:

$$Average +/- (range/2)$$

Performance values achieved by the inventive process are etching 30 A+/−1.5 A of $SiO_2$ from silicon wafers. Another common measure, loosely termed the "etch uniformity" or "sigma," is defined as the standard deviation of the $delta_n$ divided by the average etch, expressed as a percent:

$$Sigma = 100 * (\text{standard deviation of } delta_n)/average$$

The results can be specified in terms of the variation of quantity of material etched away from the surface of the object above and below the average etch effect. Surprisingly it has been found that an etching process using the methodology as described herein can achieve an etch variation of less than about +/−4 angstroms, and more preferably a variation of etch of less than about +/−2 angstroms.

By example, the etch non-uniformity that occurs during rinsing (the transition out) from HF (the treating chemical) to DI water (the non-treating liquid) can be determined by performing only that portion of the etch process. That is, the transition out can be simulated by immersing wafers in a pre-mixed HF bath and immediately beginning the DI water rinse step.

To carry out the test, a 40 l bath was filled with 200:1 aqueous HF by blending 200 cc/min of 49% HF into 40 lpm (liters per minute) of DI water. The bath and liquid flow system were as described in FIGS. 1 through 4. 52, 300 mm fill wafers were loaded in a process fixture. The fill wafers in slots 2, 25 and 51 were replaced by three test wafers covered with approximately 1,000 A of $SiO_2$. The fixture was constructed of polyvinylidene fluoride (PVDF) and held the wafers parallel at a pitch of 5 mm. The wafers were immersed in the HF bath and the DI water rinse flow was immediately started and maintained for 300 seconds, resulting in a bath having a negligible HF content. The wafers were dried by slowly draining the water from the tank while providing an IPA:$N_2$ atmosphere around the exposed portion of the wafers. Data for 40 lpm and 78 µlpm rinse flows were gathered in separate experimental runs.

Figure 11:
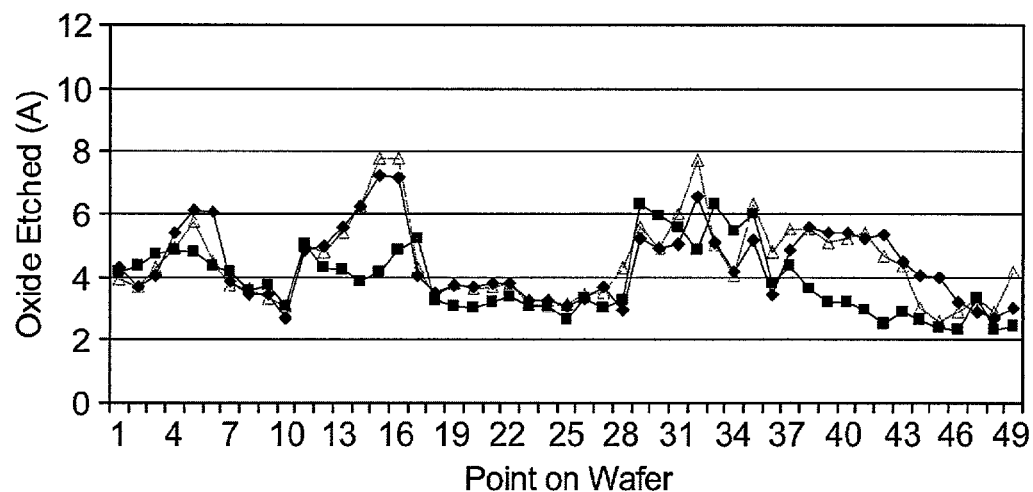
FIG. 11 is a graph showing oxide etch variation in a prior art process where a wafer is immersed in an etch bath, followed by dilution with water.
Figure 12:
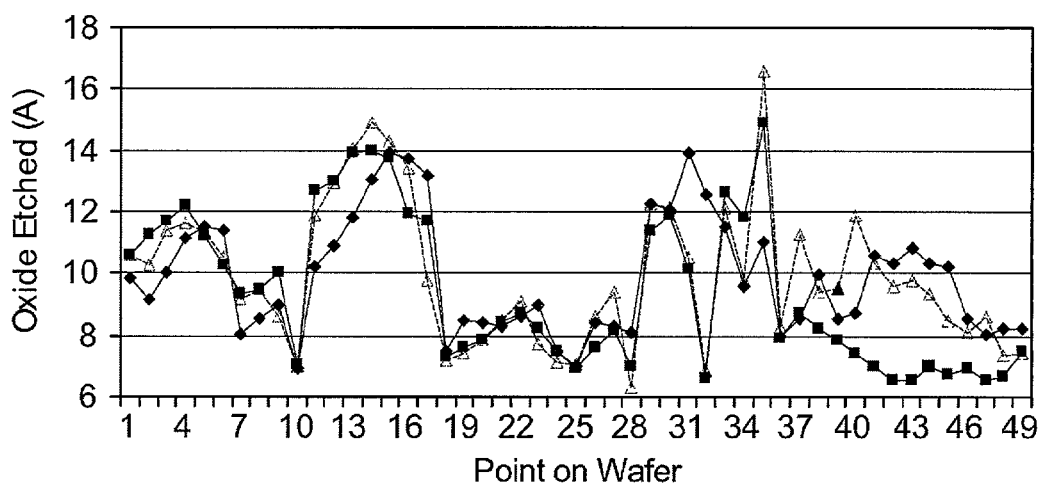
FIG. 12 is a graph showing oxide etch variation in a prior art process where a wafer is immersed in an etch bath, followed by dilution with water.

For comparison, wafers were also run through the transition etch process using the same experimental procedure, except for the liquid sequence. Wafers were immersed in the bath with 40 lpm of DI water flowing. 200 cc/min of 49% HF was then injected into the DI flow for 250 seconds. At the end of the injection, the DI water continued to flow for 300 seconds to rinse the wafers. In all cases, the variation in the oxide etched from the test wafers was measured as described above. FIGS. 11 and 12 show the results for each of the 49 points on each wafer, wherein the bulk flow of liquid through the system was at 78 lpm and 40 lpm, respectively. The range of oxide etched on individual test wafers and range of oxide etched over all points on all wafers is shown in Table 2.

While not wishing to be bound by theory, it is believed that the variation in the amount etched over a wafer results from local variations in the rate at which the HF is diluted/rinsed away by the DI water. Areas of rapid dilution are etched less than areas of slow dilution where the HF etchant persists and can act for a longer period. The 78 lpm rinse performed better than the 40 lpm rinse because, at 78 lpm, each individual area is rinsed more quickly than at 40 lpm. At 78 lpm, even HF in slowly rinsed areas has less time to etch, and hence has less time to create etch non-uniformity, compared to the same areas in the 40 lpm case.

Figure 13:
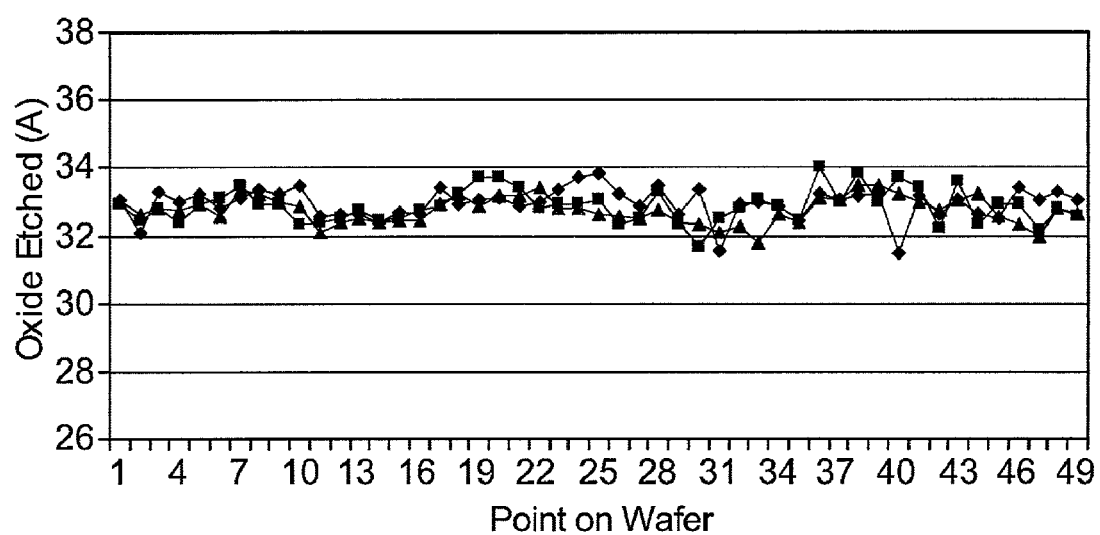
FIG. 13 is a graph showing oxide etch variation for a process of the present invention.

The results of the transition etch process of the present invention carried out at a bulk flow rate of 40 lpm are shown in FIG. 13. The total transition etch process at 40 lpm shows much better performance than a process having only transitional dilution of an acid etch shown in FIG. 12. While not wishing to be bound by theory, it is believed that variations in the transition-out segment are partially compensated by symmetric variations in the transition-in segment of the total transition etch process. That is, areas in which the HF concentration rises most quickly during the transition-in, are generally the same areas where the HF concentration drops most quickly during the transition-out.

The four-fold improvement in etch uniformity from the 40 lpm soak-etch (FIG. 12) to the 40 lpm transition etch (FIG. 13) is quite dramatic. The etch uniformity of a soak-etch typically improves with increasing rinse flow rates (compare FIG. 11 and FIG. 12). Assuming the etch uniformity of a soak-etch scales inversely with rinse flow rate (that total range is proportional to 1/rinse flow rate), the 40 lpm transition etch performs as well as a 160 lpm soak etch. Rinse flows of 160 lpm are highly undesirable due to the cost of DI water and its disposal, and the large facility infrastructure required to support such flow rates.

TABLE 2

Range of etch deltas over wafers during the rinsing (transition-out) step.

| Process | Wafer 2 range (A) | Wafer 25 range (A) | Wafer 51 range (A) | Average range (A) | Total range over all points (A) |
|---|---|---|---|---|---|
| 78 lpm rinse | 4.5 | 4.0 | 5.2 | 4.6 | 5.5 |
| 40 lpm rinse | 7.0 | 8.4 | 10.2 | 8.5 | 10.3 |
| Rinse/etch/rinse | 2.4 | 2.4 | 1.7 | 2.2 | 2.5 |

EXAMPLE 3

Figure 14:
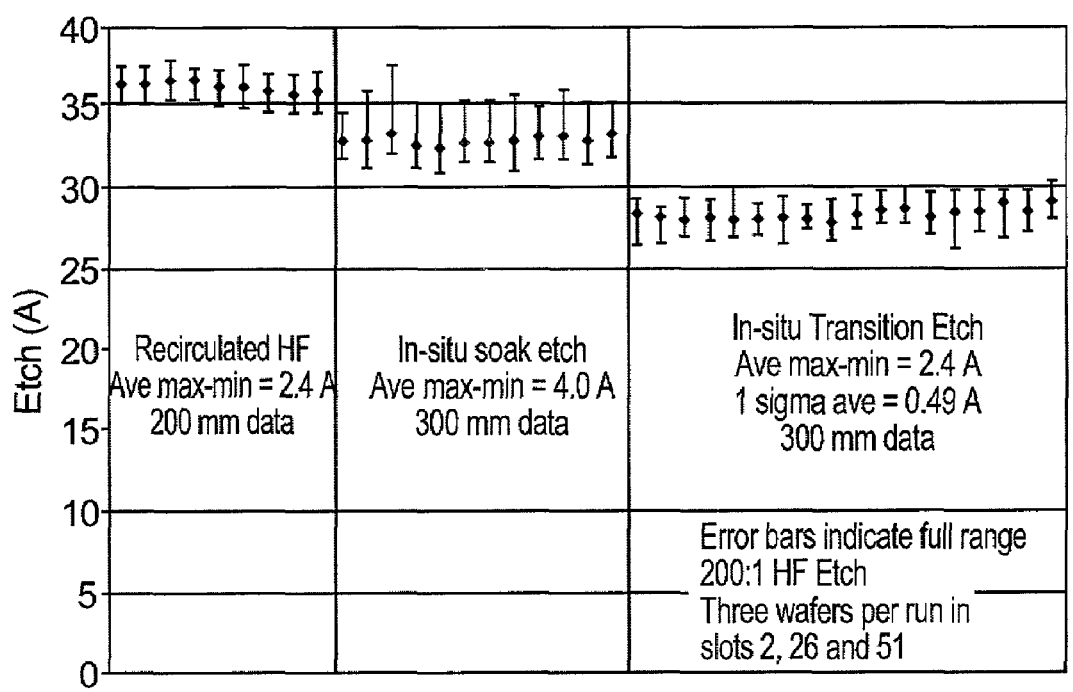
FIG. 14 is a graph comparing the uniformity of etch of wafers processed in three different ways.

Measuring of the Uniformity of a Transition Etch Compared to that of a Soak-Etch and an Etch in a Separate, Recirculated HF Bath FIG. 14 shows the etch uniformity results of wafers processed in three ways:

Comparison 3A: wafers etched by immersion in a separate, dedicated, recirculated bath of HF and transferred to a bath of flowing water for rinsing (dedicated-bath etch);

Comparison 3B: wafers etched by immersion into a pre-mixed bath of HF and soaking, followed by an in-situ rinse in the same tank (soak etch); and Comparison 3C: wafers etched by immersion into flowing DI water followed by a transition-in to flowing HF followed by a transition-out to flowing DI water (Transition Etch of the present invention)

The wafers for the dedicated-bath treatment were immersed for 140 seconds in a 40 liter bath of 200:1 HF being recirculated at 40 lpm. The wafers were then robotically transferred to a 40 l rinse bath in an etch/rinse/dry tank which overflowed DI water at 40 lpm for 300 seconds.

The wafers from the soak-etch treatment were processed entirely in the 40 l etch/rinse/dry tank. Wafers were immersed into a static bath of 200:1 HF for 140 seconds. At the end of the etch period, DI water flowed into the bath at 84 lpm for 300 seconds.

The wafers from the Transition Etch treatment were also processed entirely in the 40 l etch/rinse/dry tank. Wafers were immersed in DI water flowing at 40 lpm. HF was then injected into the 40 lpm DI water flow forming 200:1 HF for 140 seconds. The HF injection then ended, and the wafers were rinsed in the 40 lpm DI water flow for 300 seconds. In all cases, the variation in the oxide etched from the test wafers was measured as described above.

The process data is shown in FIG. 14. The on-wafer uniformity of the Transition Etch process (2.1 A average max-min) is over 10% better than that of the recirculated HF bath (2.4 A), and much better than that of the in-situ soak etch (4.0 A). The benefit of Transition Etching is even more dramatic when a 40 lpm Transition Etch (2.1 A) is compared to the 40 lpm soak etch (8.5 A from Table 2). Further, the transition etch process achieves better performance than the recirculated HF etch process, and does so in a single bath.

While the above is a full description of specific embodiments of apparatus and methods in accordance with the present invention, various modifications, alternative constructions, and equivalents may be used. For example, while the description above is in terms of a method and apparatus for semiconductor substrates, it is contemplated to implement the present invention to the manufacture of all microelectronic devices and substrates including raw wafers, disks and heads, flat panel displays, microelectronic masks, and any other applications requiring high purity wet processing such as steps of rinsing, drying, cleaning, and the like. In addition, certain systems of the Figures are described in terms of an etching system for semiconductors. One may, alternatively, employ such systems to other industries such as electro-chemical, pharmaceutical, printed circuit board, optical devices, and any other industry that needs an improved technique to treat an article of manufacture by a liquid flow technique.

Therefore, the above description and illustrations should not be taken as limiting the scope of the present invention which is defined by the appended claims.

What is claimed is:

1. A method of treating an object having a surface to be treated comprising, in order:
   a) providing the object in a bath of non-reactive liquid; wherein flow dynamics of non-reactive liquid is established such that the object is at least partially enveloped in eddy currents of the bath
   b) introducing treating chemical into the bath while at least partially enveloping the object in eddy currents of the bath liquid and increasing the concentration of treating chemical in a non-step manner throughout the bath; and
   c) introducing non-reactive liquid into the bath resulting from step b) while at least partially enveloping the object in eddy currents of the bath liquid and decreasing the concentration of treating chemical in a non-step manner throughout the bath to transition the bath to a substantially non-reactive bath.

2. The method of claim 1, wherein the eddy currents are generated by introducing treating chemical into the bath through a plurality of orifices as fluid streams.

3. The method of claim 2, wherein the fluid streams enter the bath liquid at a velocity of at least about 1,000 cm/min.

4. The method of claim 2, wherein the fluid streams enter the bath liquid at a velocity of at least about 4,000 cm/min.

5. The method of claim 2, wherein the fluid streams enter the bath liquid at a velocity of at least about 6,000 cm/min.

6. The method of claim 1 wherein the eddy currents are generated by a mixing element selected from the group consisting of an impeller, pump, or bubbler.

7. The method of claim 1, comprising generating a bulk flow of liquid through the bath by simultaneously providing new liquid entering the bath and withdrawing liquid from the bath.

8. The method of claim 7, wherein velocity of the bulk flow of liquid through the bath is from about 10 to about 100 cm/min.

9. The method of claim 7, wherein velocity of the bulk flow of liquid through the bath is from about 20 to about 50 cm/min.

10. The method of claim 7, wherein the new liquid entering the bath is provided by fluid streams, and the ratio of fluid stream velocity to bulk flow velocity is at least about 10:1.

11. The method of claim 7, wherein the new liquid entering the bath is provided by fluid streams, and the ratio of fluid stream velocity to bulk flow velocity is at least about 50:1.

12. The method of claim 7, wherein the new liquid entering the bath is provided by fluid streams, and the ratio of fluid stream velocity to bulk flow velocity is at least about 150:1.

13. The method of claim 7, wherein the liquid provision and withdrawal are provided by an overflow cascade-type system.

14. The method of claim 1, wherein the treating chemical etches the object.

15. The method of claim 1, wherein the treating chemical is an acid.

16. The method of claim 1, wherein the treating chemical is selected from one or more of the group consisting of $NH_4OH$, $HCl$, $HF$ and ozone.

17. The method of claim 1, wherein the non-reactive liquid is water.

18. The method of claim 1, wherein the concentration of the treating chemical in the liquid at a promimity of 1 mm with the object varies by no more than about 50%.

19. The method of claim 1, wherein the concentration of the treating chemical in the liquid at a proximity of 1 mm with the object varies by no more than about 20%.

20. The method of claim 1, wherein the liquid is introduced by at least one orifice spaced at least about 10 mm from the object.

21. The method of claim 20, wherein the at least one orifice directs the incoming liquid toward the object.

22. The method of claim 1, wherein the liquid is introduced by a plurality of orifices directing streams of liquid in a manner to provide effective distribution of liquid.

23. The method of claim 1, wherein the object is provide in a bath of non-reactive liquid by first filling a tank with non-reactive liquid in an amount sufficient to comletely immerse the object in the non-reactive liquid, and then immersing said object into the bath of non-reactive liquid.

24. The method of claim 1, wherein after introduction of the treating chemical into the bath, the concentration of the treating chemical in the bath is held at a constant level for a predetermined treatment time.

25. The method of claim 24, wherein the liquid in the bath is not circulated during the predetermined treatment time.

26. The method of claim 24, wherein the flow of non-reactive liquid into the bath is halted, and the liquid in the bath is circulated during the predetermined treatment time by a pump, impeller or bubbler.

27. The method of claim 1, further comprising at least one rinsing step after the treatment set forth in claim 1, wherein a flow of liquid is provided using plug flow or near plug flow conditions.

28. The method of claim 27, wherein the plug flow or near plug flow conditions are provided in part by introducing liquid to the bath at a temperature different from the temperature of the liquid in the bath and in a non-mixing manner.

29. The method of claim 1, further comprising a post treatment drying process with a surface-active agent.

30. The method of claim 1, wherein the object is an in-process semiconductor wafer.

31. A method of treating an in-process semiconductor wafer having a surface to be treated comprising, in order:

i. providing the semiconductor wafer in a bath of non-etching liquid; wherein flow dynamics of non-etching liquid is established such that the semiconductor wafer is at least partially enveloped in eddy currents of the bath ii. introducing an etching chemical into the bath while at least partially enveloping the semiconductor wafer in eddy currents of the bath liquid and increasing the concentration of etching chemical in a non-step manner Throughout the bath; and iii. introducing non-etching liquid into the bath resulting from step ii) while at least partially enveloping the semiconductor wafer in eddy currents of the bath liquid and decreasing the concentration of etching chemical in a non-step manner throughout the bath.

32. The method of claim 31, wherein the eddy currents are generated by introducing etching chemical into the bath through a plurality of orifices as fluid streams.

\* \* \* \* \*

UNITED STATES PATENT AND TRADEMARK OFFICE
CERTIFICATE OF CORRECTION

| | |
|---|---|
| PATENT NO. | : 7,156,927 B2 |
| APPLICATION NO. | : 10/115449 |
| DATED | : January 2, 2007 |
| INVENTOR(S) | : Kurt Karl Christenson et al. |

It is certified that error appears in the above-identified patent and that said Letters Patent is hereby corrected as shown below:

Column 17
Line 25, "78 μlpm" should be -- 78 lpm --.

Column 20
Line 37, "provide" should be -- provided--.

Signed and Sealed this

Twenty-fourth Day of April, 2007

JON W. DUDAS
*Director of the United States Patent and Trademark Office*